(12) United States Patent
Kono et al.

(10) Patent No.: US 9,178,079 B2
(45) Date of Patent: Nov. 3, 2015

(54) SEMICONDUCTOR DIODE DEVICE

(71) Applicant: Kabushiki Kaisha Toshiba, Tokyo (JP)

(72) Inventors: Hiroshi Kono, Hyogo-ken (JP); Ryoichi Ohara, Hyogo-ken (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 0 days.

(21) Appl. No.: 14/203,255

(22) Filed: Mar. 10, 2014

(65) Prior Publication Data

US 2015/0069414 A1 Mar. 12, 2015

(30) Foreign Application Priority Data

Sep. 11, 2013 (JP) ................................. 2013-188156

(51) Int. Cl.
| | |
|---|---|
| H01L 29/00 | (2006.01) |
| H01L 29/872 | (2006.01) |
| H01L 29/16 | (2006.01) |
| H01L 21/18 | (2006.01) |
| H01L 29/861 | (2006.01) |

(52) U.S. Cl.
CPC .............. *H01L 29/872* (2013.01); *H01L 21/18* (2013.01); *H01L 29/1608* (2013.01); *H01L 29/8611* (2013.01); *H01L 2924/12032* (2013.01); *H01L 2924/12036* (2013.01)

(58) Field of Classification Search
CPC ................... H01L 2924/12032; H01L 29/872; H01L 2924/12036; H01L 29/8611
See application file for complete search history.

(56) References Cited

U.S. PATENT DOCUMENTS

| | | | | |
|---|---|---|---|---|
| 6,049,109 | A | * 4/2000 | Omura et al. | ................. 257/347 |
| 7,728,402 | B2 | 6/2010 | Zhang et al. | |
| 8,232,558 | B2 | 7/2012 | Zhang et al. | |
| 2009/0206365 | A1* | 8/2009 | Tsukuda et al. | .............. 257/139 |
| 2012/0212164 | A1 | 8/2012 | Terakawa et al. | |
| 2012/0228636 | A1 | 9/2012 | Maeyama et al. | |
| 2014/0138699 | A1* | 5/2014 | Hikosaka et al. | ............... 257/76 |

FOREIGN PATENT DOCUMENTS

JP   2012-231019 A   11/2012

* cited by examiner

*Primary Examiner* — Ngan Ngo
(74) *Attorney, Agent, or Firm* — David M. Tennant

(57) ABSTRACT

According to one embodiment, a semiconductor device includes first and second electrodes, and first, second, and third semiconductor regions. The first semiconductor region has a first conductivity type. The first electrode is provided above the first semiconductor region. The second semiconductor region has a second conductivity type and is provided between the first semiconductor region and the first electrode. The third semiconductor region is provided between the first semiconductor region and the first electrode, and has the second conductivity type. The third semiconductor region has an impurity concentration substantially equal to an impurity concentration of the second semiconductor region, and has first and second portions. The first and second portions constitute a concave-convex form on a side of the first semiconductor region of the third semiconductor region. The second electrode is provided above an opposite side of the first semiconductor region from the first electrode.

17 Claims, 7 Drawing Sheets

SEMICONDUCTOR DIODE DEVICE

CROSS-REFERENCE TO RELATED APPLICATIONS

This application is based upon and claims the benefit of priority from Japanese Patent Application No. 2013-188156, filed on Sep. 11, 2013; the entire contents of which are incorporated herein by reference.

FIELD

Embodiments described herein relate generally to a semiconductor device and a method for manufacturing the same.

BACKGROUND

As a semiconductor device having a rectifying function, a JBS (junction barrier Schottky) diode in which a Schottky barrier junction and a p-n junction coexist is known. The JBS diode includes a plurality of p-type semiconductor regions formed in an n-type semiconductor region and a Schottky barrier metal that is in contact with the n-type semiconductor region and the p-type semiconductor region. The JBS diode is a structure that relaxes the electric field at the interface between the n-type semiconductor region and the Schottky electrode during reverse bias and reduces leakage. For the semiconductor device, it is important to further improve the withstand capability to surge voltage etc.

DETAILED DESCRIPTION

Figure 1:
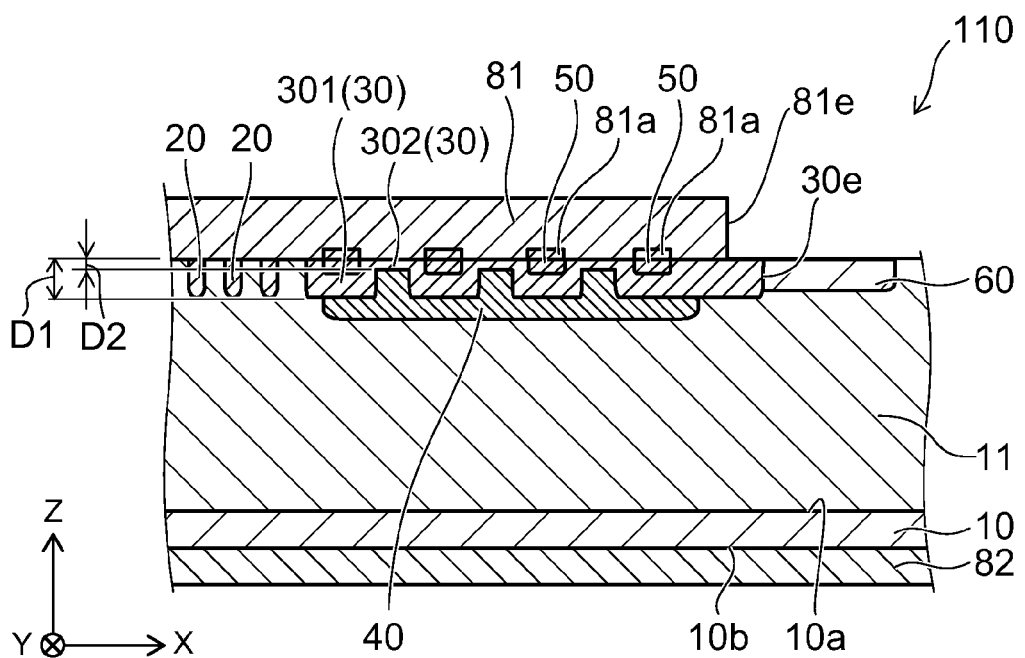
FIG. 1 is a schematic cross-sectional view illustrating the configuration of a semiconductor device according to a first embodiment.

In general, according to one embodiment, a semiconductor device includes a first semiconductor region, a first electrode, a second semiconductor region, a third semiconductor region, and a second electrode. The first semiconductor region has a first conductivity type. The first electrode is provided above the first semiconductor region. The second semiconductor region has a second conductivity type and is provided between the first semiconductor region and the first electrode. The third semiconductor region is provided between the first semiconductor region and the first electrode, and has the second conductivity type. The third semiconductor region has an impurity concentration substantially equal to an impurity concentration of the second semiconductor region, and has a first portion and a second portion with a depth shallower than the first portion. The first portion and the second portion constitute a concave-convex form on a side of the first semiconductor region of the third semiconductor region. The second electrode is provided above an opposite side of the first semiconductor region from the first electrode.

Various embodiments will be described hereinafter with reference to the accompanying drawings. In the following description, identical components are marked with the same reference numerals, and a description of components once described is omitted as appropriate. In the following description, the expressions of $n^+$, $n$, and $n^-$ and $p^+$, $p$, and $p^-$ indicate the relative level in the impurity concentration in the conductivity types. That is, the larger the number of "+" is, the higher the impurity concentration is; and the larger the number of "−" is, the lower the impurity concentration is. In the following description, specific examples in which the first conductivity type is the n-type and the second conductivity type is the p-type are given as examples.

First Embodiment

FIG. 1 is a schematic cross-sectional view illustrating the configuration of a semiconductor device according to a first embodiment.

Figure 2:
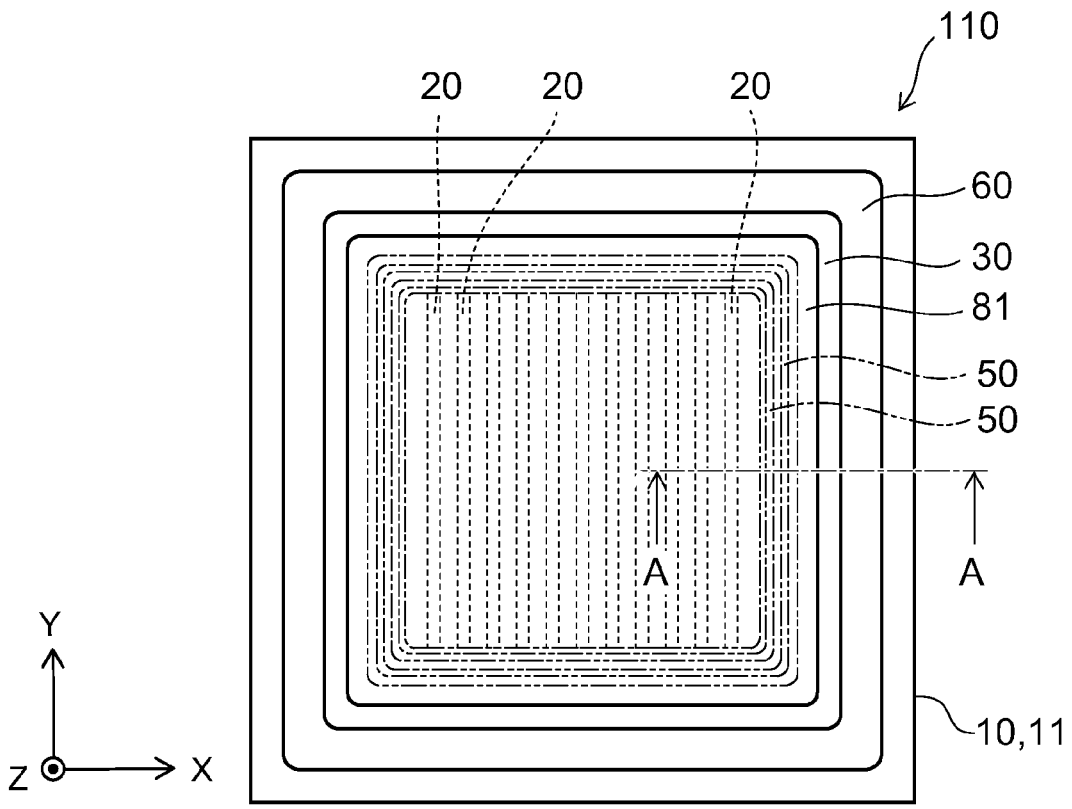
FIG. 2 is a schematic plan view illustrating the configuration of the semiconductor device according to the first embodiment.

FIG. 2 is a schematic plan view illustrating the configuration of the semiconductor device according to the first embodiment.

FIG. 1 shows a schematic cross-sectional view taken along line A-A shown in FIG. 2. In FIG. 2, the configuration on the lower side of an anode electrode (a first electrode) 81 is shown by the broken lines.

As shown in FIG. 1, a semiconductor device 110 according to the embodiment includes an $n^{--}$-type semiconductor region (a first semiconductor region) 11, an anode electrode (a first electrode) 81, a first p-type semiconductor region (a second semiconductor region) 20, a second p-type semiconductor region (a third semiconductor region) 30, and a cathode electrode (a second electrode) 82. The semiconductor device 110 includes a JBS diode and an avalanche diode. The semiconductor device 110 may further include at least one of an $n^-$-type semiconductor region (a fourth semiconductor region) 40, a $p^+$-type semiconductor region (a fifth semiconductor region) 50, and a $p^-$-type semiconductor region (a sixth semiconductor region) 60.

The $n^{--}$-type semiconductor region 11 is provided on an $n^+$-type substrate 10, for example. A silicon carbide (SiC) substrate is used as the substrate 10, for example. SiC of a hexagonal crystal (for example, 4H—SiC) is included in the substrate 10, for example. The substrate 10 is a bulk substrate of SiC fabricated by the sublimation method, for example. The substrate 10 is doped with an n-type impurity (for example, nitrogen (N)). The concentration of the impurity of the substrate 10 is approximately not less than $1 \times 10^{18}$ cm$^{-3}$ and not more than $5 \times 10^{18}$ cm$^{-3}$, for example.

The $n^{--}$-type semiconductor region 11 is a region formed on a first surface 10a of the substrate 10 by epitaxial growth, for example. The $n^{--}$-type semiconductor region 11 includes SiC, for example. An n-type impurity (for example, N) is included in the $n^{--}$-type semiconductor region 11. The concentration of the impurity of the $n^{--}$-type semiconductor region 11 is approximately not less than $5 \times 10^{14}$ cm$^{-3}$ and not more than $5 \times 10^{16}$ cm$^{-3}$, for example. The concentration of the impurity of the n⁻⁻⁻-type semiconductor region 11 is lower than the concentration of the impurity of the substrate 10. In the embodiment, the concentration of the impurity of the n⁻⁻⁻-type semiconductor region 11 is approximately not less than $1×10^{15}$ cm⁻³ and not more than $2×10^{16}$ cm⁻³.

The thickness of the n⁻⁻⁻-type semiconductor region 11 is determined by the design of the breakdown voltage characteristics and other characteristics of the semiconductor device 110. For example, when the breakdown voltage is 600 volts (V), the thickness of the n⁻⁻⁻-type semiconductor region 11 is approximately not less than 3.5 micrometers (μm) and not more than 7 μm.

The anode electrode 81 is joined to the n⁻⁻⁻-type semiconductor region 11 by Schottky junction. The anode electrode 81 is provided on the opposite side of the n⁻⁻⁻-type semiconductor region 11 from the substrate 10. In the embodiment, the direction connecting the n⁻⁻⁻-type semiconductor region 11 and the anode electrode 81 is defined as the Z-direction, one direction orthogonal to the Z-direction is defined as the X-direction, and the direction orthogonal to the Z-direction and the X-direction is defined as the Y-direction. The direction from the n⁻⁻⁻-type semiconductor region 11 toward the anode electrode 81 along the Z-direction is referred to as upward (the upward direction), and the opposite direction is referred to as downward (the downward direction).

The anode electrode 81 is provided on the n⁻⁻⁻-type semiconductor region 11. A Schottky barrier diode (SBD) is formed by the Schottky junction of the anode electrode 81 and the n⁻⁻⁻-type semiconductor region 11. Titanium (Ti) is used for the anode electrode 81, for example.

The first p-type semiconductor region 20 is provided between the n⁻⁻⁻-type semiconductor region 11 and the anode electrode 81. The first p-type semiconductor region 20 is in contact with the anode electrode 81. The first p-type semiconductor region 20 includes SiC, for example.

A p-type impurity (for example, aluminum (Al) or boron (B)) is included in the first p-type semiconductor region 20. The concentration of the impurity of the first p-type semiconductor region 20 is approximately not less than $5×10^{17}$ cm⁻³ and not more than $1×10^{19}$ cm⁻³, for example. In the embodiment, the concentration of the impurity of the first p-type semiconductor region 20 is approximately $1×10^{18}$ cm⁻³. The thickness (the thickness in the Z-direction) of the first p-type semiconductor region 20 is approximately not less than 0.3 μm and not more than 1.2 μm, for example. A p-n junction is formed at the boundary between the first p-type semiconductor region 20 and the n⁻⁻⁻-type semiconductor region 11.

As shown in FIG. 2, the first p-type semiconductor region 20 is provided to extend in one direction, for example. In the embodiment, the first p-type semiconductor region 20 extends in the Y-direction. The first p-type semiconductor region 20 may be provided in plural. The plurality of first p-type semiconductor regions 20 may be provided parallel at prescribed intervals. Each of the plurality of first p-type semiconductor regions 20 may be provided in an island shape.

The second p-type semiconductor region 30 is provided between the n⁻⁻⁻-type semiconductor region 11 and the anode electrode 81. The second p-type semiconductor region 30 is joined to the anode electrode 81 by ohmic junction. The second p-type semiconductor region 30 includes SiC, for example.

A p-type impurity (for example, Al or B) is included in the second p-type semiconductor region 30. The concentration of the impurity of the second p-type semiconductor region 30 is approximately not less than $5×10^{17}$ cm⁻³ and not more than $1×10^{19}$ cm⁻³, for example. The concentration of the impurity of the second p-type semiconductor region 30 may be substantially the same as the concentration of the impurity of the first p-type semiconductor region 20. In the embodiment, "substantially the same" refers to the case of being the same and the case of including errors in the manufacturing.

The second p-type semiconductor region 30 has a first portion 301 and a second portion 302. The first portion 301 has a depth of D1 (a first depth). The depth D1 is the length in the Z-direction from the boundary between the n⁻⁻⁻-type semiconductor region 11 and the anode electrode 81 toward the n⁻⁻⁻-type semiconductor region 11 side.

The second portion 302 is adjacent to the first portion 301. The second portion 302 has a depth of D2 (a second depth). The depth D2 is the length in the Z-direction from the boundary between the n⁻⁻⁻-type semiconductor region 11 and the anode electrode 81 toward the n⁻⁻⁻-type semiconductor region 11 side. The depth D2 is shallower than the depth D1.

The first portion 301 and the second portion 302 provide a convex form and a concave form on the interface on the n⁻⁻⁻-type semiconductor region 11 side of the second p-type semiconductor region 30. In the semiconductor device 110, a plurality of first portions 301 and a plurality of second portions 302 are provided. Each first portion 301 and each second portion 302 are alternately provided in a direction orthogonal to the Z-direction. Thereby, a plurality of convex forms and a plurality of concave forms are provided on the interface on the n⁻⁻⁻-type semiconductor region 11 side of the second p-type semiconductor region 30.

Although the plurality of first portions 301 and the plurality of second portions 302 are alternately arranged in the X-direction in the example shown in FIG. 1, they may be alternately arranged in the Y-direction. A plurality of first portions 301 and a plurality of second portions 302 may be alternately arranged in each of the X-direction and the Y-direction.

The first depth D1 is approximately not less than 0.3 μm and not more than 1.2 μm, for example. The second depth D2 is approximately not less than 10% and not more than 90% of the first depth D1, for example. The second depth D2 is approximately not less than 50 nanometers (nm) and not more than 1000 nm, for example. The first depth D1 may be substantially the same as the depth of the first p-type semiconductor region 20.

The second p-type semiconductor region 30, the n⁻⁻⁻-type semiconductor region 11, and the substrate 10 constitute an avalanche diode. As shown in FIG. 2, the second p-type semiconductor region 30 may be provided so as to surround the periphery of the plurality of first p-type semiconductor regions 20 as viewed in the Z-direction. The second p-type semiconductor region 30 may be provided next to the plurality of first p-type semiconductor regions 20 as viewed in the Z-direction.

The n⁻-type semiconductor region 40 is provided between the n⁻⁻⁻-type semiconductor region 11 and the second p-type semiconductor region 30. The n⁻-type semiconductor region 40 is in contact with the second p-type semiconductor region 30. That is, the n⁻-type semiconductor region 40 is in contact with the interface having a convex form and a concave form provided on the n⁻⁻⁻-type semiconductor region 11 side of the second p-type semiconductor region 30. The n⁻-type semiconductor region 40 includes SiC, for example.

An n-type impurity (for example, N) is included in the n⁻-type semiconductor region 40. The concentration of the impurity of the n⁻-type semiconductor region 40 is approximately not less than $1×10^{17}$ cm⁻³ and not more than $1×10^{18}$ cm⁻³, for example. The concentration of the impurity of the n⁻-type semiconductor region 40 is higher than the concentration of the impurity of the n⁻⁻⁻-type semiconductor region 11. In the embodiment, the concentration of the impurity of the n⁻-type semiconductor region 40 is approximately $2×10^{17}$ cm$^{-3}$.

The p⁺-type semiconductor region 50 is provided between the second p-type semiconductor region 30 and the anode electrode 81. The p⁺-type semiconductor region 50 is provided between the first portion 301 of the second p-type semiconductor region 30 and the anode electrode 81, for example. The p⁺-type semiconductor region 50 is in contact with the anode electrode 81. The p⁺-type semiconductor region 50 includes SiC, for example.

A p-type impurity (for example, Al or B) is included in the p⁺-type semiconductor region 50. The concentration of the impurity of the p⁺-type semiconductor region 50 is approximately not less than $2×10^{19}$ cm$^{-3}$ and not more than $5×10^{20}$ cm$^{-3}$, for example. The concentration of the impurity of the p⁺-type semiconductor region 50 is higher than the concentration of the impurity of the second p-type semiconductor region 30. The p⁺-type semiconductor region 50 is provided in order to join the second p-type semiconductor region 30 and the anode electrode 81 by ohmic junction surely. In the embodiment, the concentration of the impurity of the p⁺-type semiconductor region 50 is approximately $1×10^{20}$ cm$^{-3}$.

In the case where a plurality of first portions 301 are provided, the p⁺-type semiconductor region 50 may be provided between each of the plurality of first portions 301 and the anode electrode 81. The p⁺-type semiconductor region 50 is preferably provided on the inside (in the interior) of the second p-type semiconductor region 30. That is, the p⁺-type semiconductor region 50 is preferably surrounded by the second p-type semiconductor region 30; in other words, the p⁺-type semiconductor region 50 is preferably not in contact with the n⁻⁻-type semiconductor region 11. Thereby, a leakage current is suppressed.

An ohmic electrode (a third electrode) 81a for making ohmic junction surely may be provided between the p⁺-type semiconductor region 50 and the anode electrode 81. The resistivity of the ohmic electrode 81a is lower than the resistivity of the anode electrode 81. Nickel (Ni) or nickel silicide is used for the ohmic electrode 81a, for example.

The cathode electrode 82 is provided on the opposite side of the n⁻⁻-type semiconductor region 11 from the anode electrode 81. In the embodiment, the cathode electrode 82 is in contact with a second surface 10b of the substrate 10. The second surface 10b is the surface on the opposite side to the first surface 10a of the substrate 10. The cathode electrode 82 is joined to the substrate 10 by ohmic junction. Ni is used for the cathode electrode 82, for example.

The p⁻-type semiconductor region 60 is provided adjacent to the second p-type semiconductor region 30. The p⁻-type semiconductor region 60 may be provided so as to surround an end 30e of the second p-type semiconductor region 30. The p⁻-type semiconductor region 60 includes a p-type impurity (for example, Al or B). The concentration of the impurity of the p⁻-type semiconductor region 60 is approximately not less than $1×10^{17}$ cm$^{-3}$ and not more than $1×10^{18}$ cm$^{-3}$, for example. The concentration of the impurity of the p⁻-type semiconductor region 60 is lower than the concentration of the impurity of the second p-type semiconductor region 30. The p⁻-type semiconductor region 60 is a terminal region of the semiconductor device 110. In the embodiment, the concentration of the impurity of the p⁻-type semiconductor region 60 is approximately $5×10^{17}$ cm$^{-3}$.

In the semiconductor device 110, as viewed in the Z-direction, the end 30e of the second p-type semiconductor region 30 is provided between the outer periphery edge 81e of the anode electrode 81 and the p⁻-type semiconductor region 60.

That is, the second p-type semiconductor region 30 is provided from the inside to the outside of the anode electrode 81 as viewed in the Z-direction.

The semiconductor device 110 like this includes a JBS diode composed of the anode electrode 81, the cathode electrode 82, the n⁻⁻-type semiconductor region 11, and the first p-type semiconductor region 20 and an avalanche diode composed of the anode electrode 81, the cathode electrode 82, the n⁻⁻-type semiconductor region 11, and the second p-type semiconductor region 30. The avalanche diode is connected in parallel to the JBS diode.

Next, operations of the semiconductor device 110 are described.

When a (forward) voltage is applied so that the anode electrode 81 is positive with respect to the cathode electrode 82 of the semiconductor device 110, electrons that have surmounted the Schottky barrier from the anode electrode 81 flow through the n⁻⁻-type semiconductor region 11 and the substrate 10 to the cathode electrode 82. When the voltage exceeds a prescribed voltage (for example, 3 V), electrons and holes that have surmounted the built-in potential flow via the p-n junction surface existing at the interface between the second p-type semiconductor region 30 and the n⁻⁻-type semiconductor region 11.

On the other hand, a (reverse) voltage is applied so that the anode electrode 81 is negative with respect to the cathode electrode 82, electrons can hardly surmount the Schottky barrier between the anode electrode 81 and the n⁻⁻-type semiconductor region 11, and the flow of electrons is suppressed. A depletion layer extends mainly to the n⁻⁻-type semiconductor region 11 side of the p-n junction surface, and little current flows through the semiconductor device 110. When a reverse voltage is applied, the electric field at the interface between the anode electrode 81 and the n⁻⁻-type semiconductor region 11 is relaxed by the first p-type semiconductor region 20. Thereby, the breakdown voltage is improved.

In the semiconductor device 110, both a low ON voltage obtained by the SBD and a low ON resistance obtained by the P—N diode can be achieved.

Here, when a surge voltage whereby the anode electrode 81 becomes negative is applied to the semiconductor device 110, the electric field is likely to be concentrated at the end 30e of the second p-type semiconductor region 30. In the semiconductor device 110, a convex form and a concave form are formed on the interface on the n⁻⁻-type semiconductor region 11 side of the second p-type semiconductor region 30 by means of the depth difference between the first portion 301 and the second portion 302 of the second p-type semiconductor region 30.

Due to the effect of the configuration of the second p-type semiconductor region 30, the breakdown voltage in the p-n junction portion (the boundary portion between the second p-type semiconductor region 30 and the n⁻⁻-type semiconductor region 11) is lowered as compared to the case where no concave-convex form is provided. Consequently, when a surge voltage is applied, breakdown is more likely to occur at the interface on the n⁻⁻-type semiconductor region 11 side of the second p-type semiconductor region 30. In the semiconductor device 110, the concentration of breakdown in the terminal region is suppressed, and element breaking in the terminal region is prevented.

The breakdown voltage in the second p-type semiconductor region 30 is preferably set lower than the breakdown voltage in the terminal region. Thereby, breakdown occurs earlier in the portion of the second p-type semiconductor region 30 than in the terminal region. Consequently, in the semiconductor device 110, element breaking in the terminal region due to breakdown is prevented.

In the semiconductor device 110, a leakage current is suppressed in the second p-type semiconductor region 30 by the second portion 302 provided shallower than the first portion 301. By providing the second portion 302, the electric field applied to the Schottky interface can be relaxed, and high voltage leakage is suppressed. Here, the Schottky portion relaxes the electric field using the JBS structure. Hence, if the second portion 302 is not provided, the dimensions of the second p-type semiconductor region 30 cannot deviate from the JBS dimensions. Since N is implanted into the second p-type semiconductor region 30, the electric field applied to the Schottky interface is increased. By providing the second portion 302, the period of the concave-convex of the second p-type semiconductor region 30 can be set independently of the JBS dimensions, and the concentration of implanted N of the second p-type semiconductor region 30 can be set to an optimum value independently of the trade-off with Schottky leakage.

Figure 3:
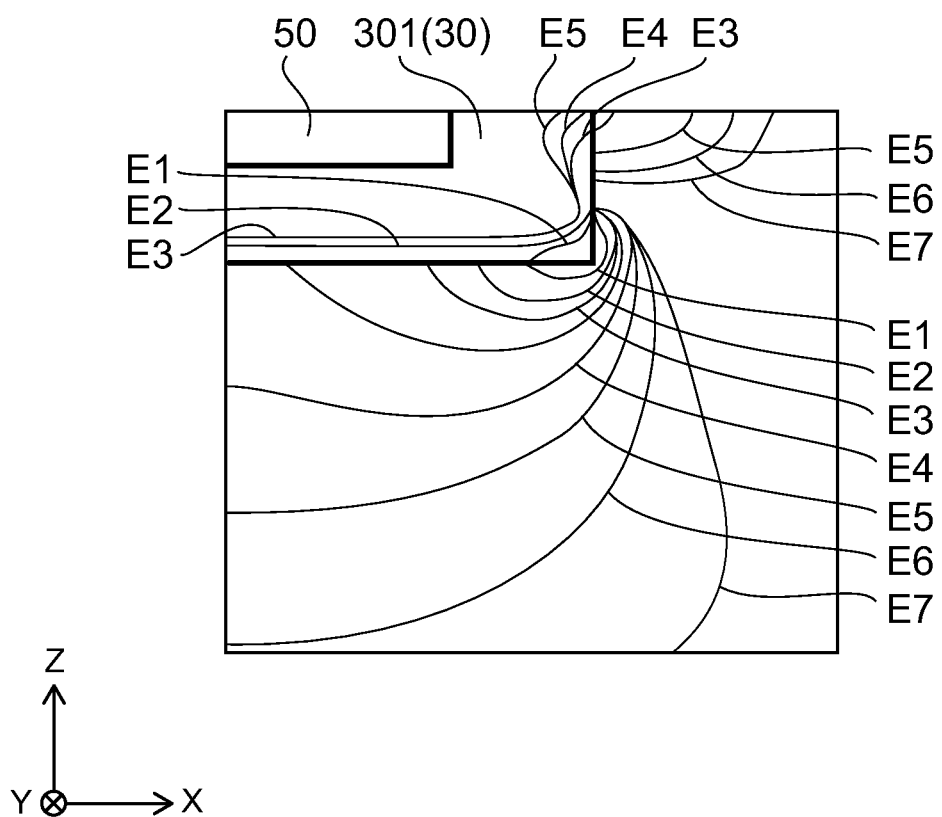
FIG. 3 is a diagram illustrating an electric field intensity distribution.

FIG. 3 is a diagram illustrating an electric field intensity distribution.

The horizontal axis of FIG. 3 represents the position in the X-direction, and the vertical axis represents the position in the Z-direction. FIG. 3 shows the electric field intensity distribution in the first portion 301 of the second p-type semiconductor region 30. The electric field intensity distribution is shown by electric field contour lines of electric field intensities E1 to E7. The value of the electric field intensity decreases in the order of from the electric field intensity E1 to the electric field intensity E7.

As shown in FIG. 3, it can be seen that the electric field intensity is high particularly in the corner portion of the first portion 301. Thus, by providing the first portion 301 and the second portion 302 as the second p-type semiconductor region 30, electric field concentration due to the effect of the configuration of the second p-type semiconductor region 30 is brought about, and the breakdown voltage is lowered. By providing a plurality of first portions 301 and a plurality of second portions 302, the effect of electric field concentration due to the concave-convex form is enhanced.

Thus, in the semiconductor device 110, by providing the second p-type semiconductor region 30 having the first portion 301 and the second portion 302, it is made easier to cause breakdown in the second p-type semiconductor region 30, and breakdown concentrated in the terminal region is suppressed. Consequently, element breaking in the terminal region is prevented. That is, in the semiconductor device 110, the withstand capability to surge voltage etc. is improved.

Next, a method for manufacturing the semiconductor device 110 is described.

FIG. 4A to FIG. 6B are schematic cross-sectional views illustrating a method for manufacturing a semiconductor device.

Figure 4A:
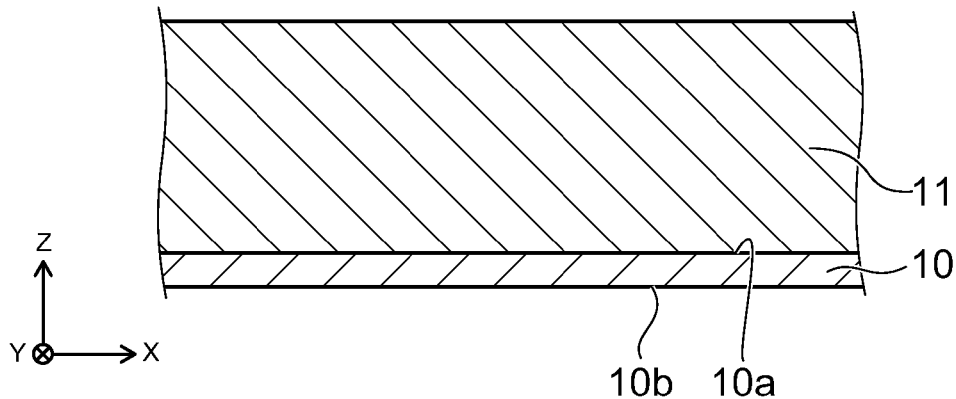
FIG. 4A to FIG. 4C are schematic cross-sectional views illustrating a method for manufacturing the semiconductor device.

First, as shown in FIG. 4A, the n$^{--}$-type semiconductor region 11 is formed on the first surface 10a of the substrate 10. A bulk substrate of SiC is used as the substrate 10, for example. The substrate 10 is doped with an n-type impurity (for example, nitrogen (N)). The concentration of the impurity of the substrate 10 is approximately not less than $1\times10^{18}$ cm$^{-3}$ and not more than $5\times10^{18}$ cm$^{-3}$, for example.

The n$^{--}$-type semiconductor region 11 is formed on the first surface 10a of the substrate 10 by epitaxial growth. The n$^{--}$-type semiconductor region 11 includes SiC, for example. An n-type impurity (for example, N) is included in the n$^{--}$-type semiconductor region 11. The concentration of the impurity of the n$^{--}$-type semiconductor region 11 is approximately not less than $5\times10^{14}$ cm$^{-3}$ and not more than $5\times10^{16}$ cm$^{-3}$, for example. The concentration of the impurity of the n$^{--}$-type semiconductor region 11 is lower than the concentration of the impurity of the substrate 10.

Figure 4B:
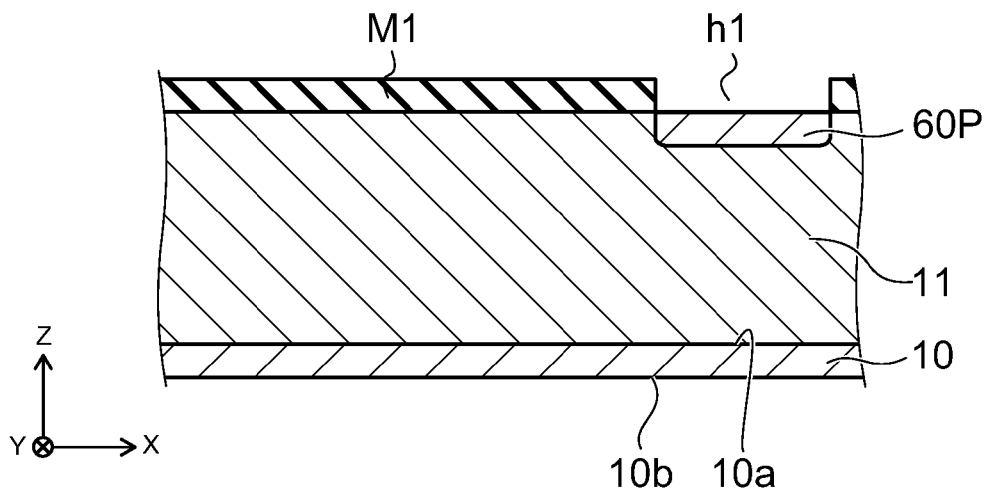

Next, as shown in FIG. 4B, a mask M1 is formed on the n$^{--}$-type semiconductor region 11, and an opening h1 is provided. The position of the opening h1 is on the upper side of the position where the p$^{-}$-type semiconductor region 60 will be formed. Then, ions of a p-type impurity such as Al are implanted via the opening h1 of the mask M1.

Thereby, an ion implantation region 60P containing the p-type impurity is formed in the n$^{--}$-type semiconductor region 11 under the opening h1. After that, the mask M1 is removed.

Figure 4C:
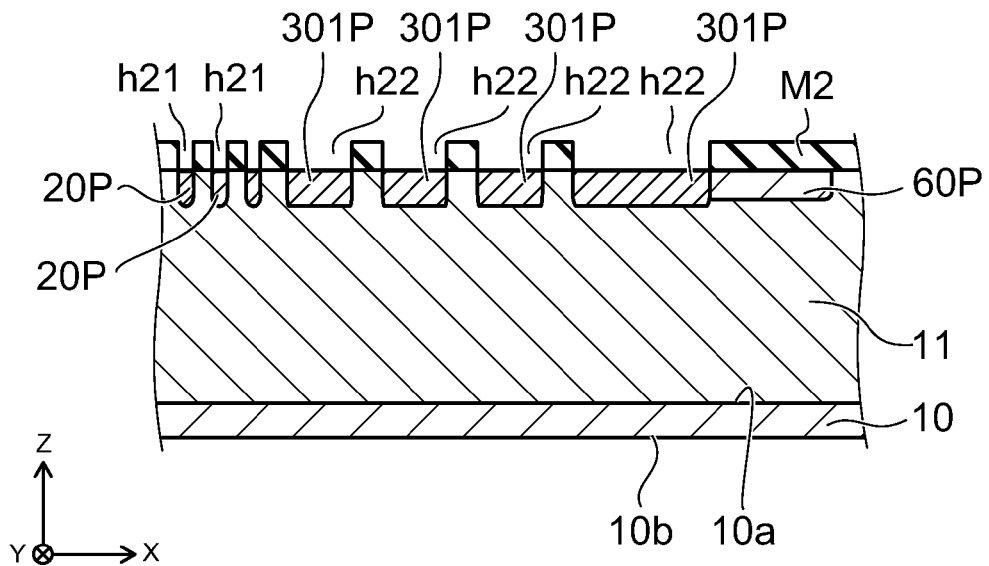

Next, as shown in FIG. 4C, a mask M2 is formed on the n$^{--}$-type semiconductor region 11, and openings h21 and h22 are provided. The position of the opening h21 is on the upper side of the position where the first p-type semiconductor region 20 will be formed. The position of the opening h22 is on the upper side of the position where the first portion 301 of the second p-type semiconductor region 30 will be formed.

The shape, size, and pitch of the first p-type semiconductor region 20 of a JBS diode are determined by the shape, size, and pitch of the opening h21. The shape, size, and pitch of the first portion 301 of the second p-type semiconductor region 30 of an avalanche diode are determined by the shape, size, and pitch of the opening h22.

Then, p-type impurity ions of Al or the like are implanted via the openings h21 and h22 of the mask M2. Thereby, an ion implantation region 20P containing the p-type impurity is formed in the n$^{--}$-type semiconductor region 11 under the opening h21. Furthermore, an ion implantation region 301P containing the p-type impurity is formed in the n$^{--}$-type semiconductor region 11 under the opening h22. After that, the mask M2 is removed.

Figure 5A:
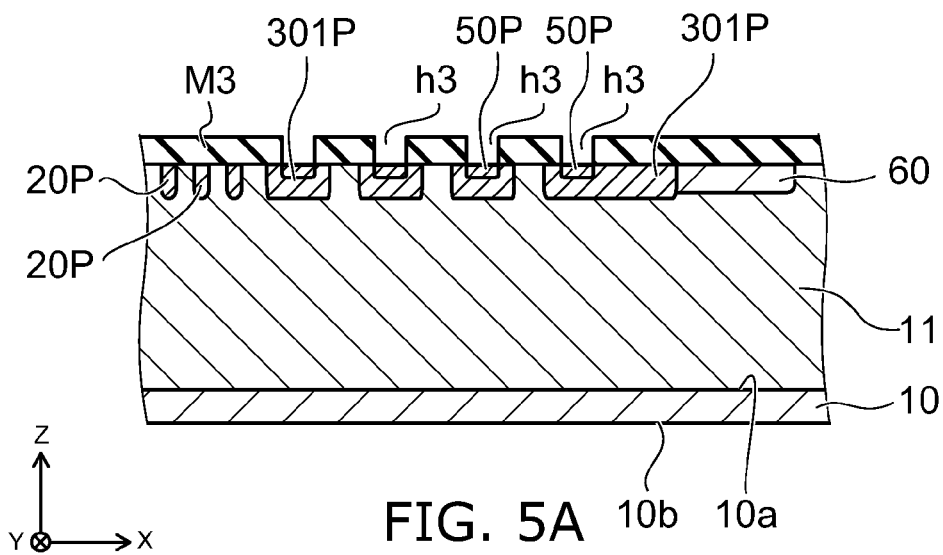
FIG. 5A to FIG. 5C are schematic cross-sectional views illustrating a method for manufacturing the semiconductor device.

Next, as shown in FIG. 5A, a mask M3 is formed on the n$^{--}$-type semiconductor region 11, and openings h3 are provided. The position of the opening h3 is on the upper side of the ion implantation region 301P. Then, ions of a p-type impurity such as Al are implanted via the opening h3 of the mask M3. Thereby, an ion implantation region 50P containing the p-type impurity is formed on the surface side of the ion implantation region 301P under the opening h3. After that, the mask M3 is removed.

Figure 5B:
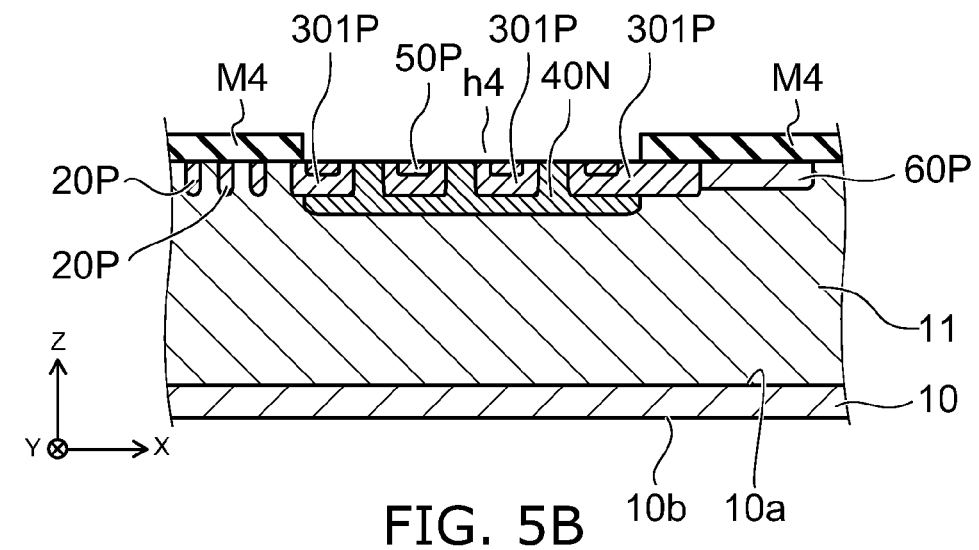

Next, as shown in FIG. 5B, a mask M4 is formed on the n$^{--}$-type semiconductor region 11, and an opening h4 is provided. The range of the opening h4 is a range on the inside of the second p-type semiconductor region 30 as viewed in the Z-direction. Then, ions of an n-type impurity such as N are implanted via the opening h4 of the mask M4. Thereby, an ion implantation region 40N containing the n-type impurity is formed in the n$^{--}$-type semiconductor region 11 and on the lower side of the ion implantation region 301P under the opening h4.

Figure 5C:
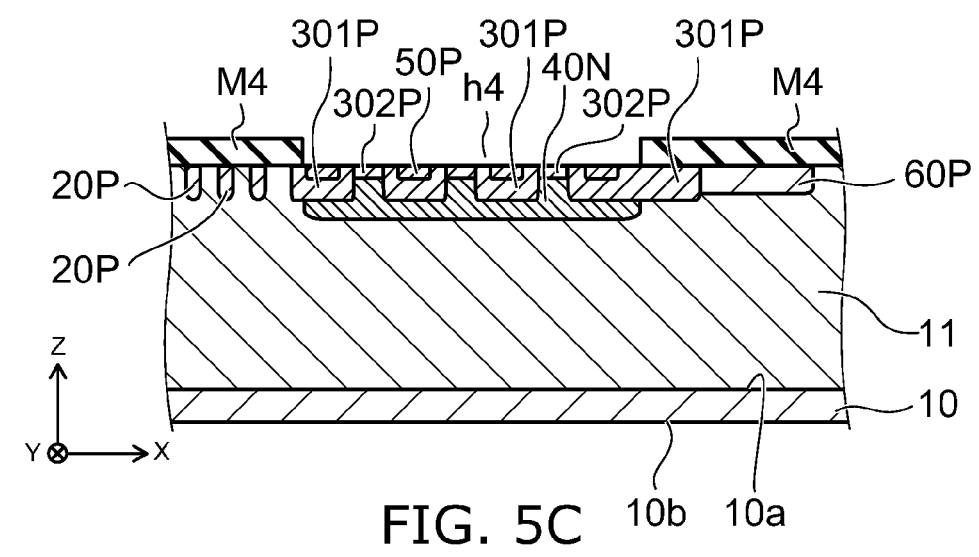

Next, as shown in FIG. 5C, the mask M4 used in the previous ion implantation is used to implant p-type impurity ions of Al or the like. Thereby, an ion implantation region 302P containing the p-type impurity is formed under the opening h4. At this time, the ion implantation region 302P is formed in a position shallower than the depth of the ion implantation region 301P in accordance with the conditions of the ion implantation. After that, the mask M4 is removed.

Figure 6A:
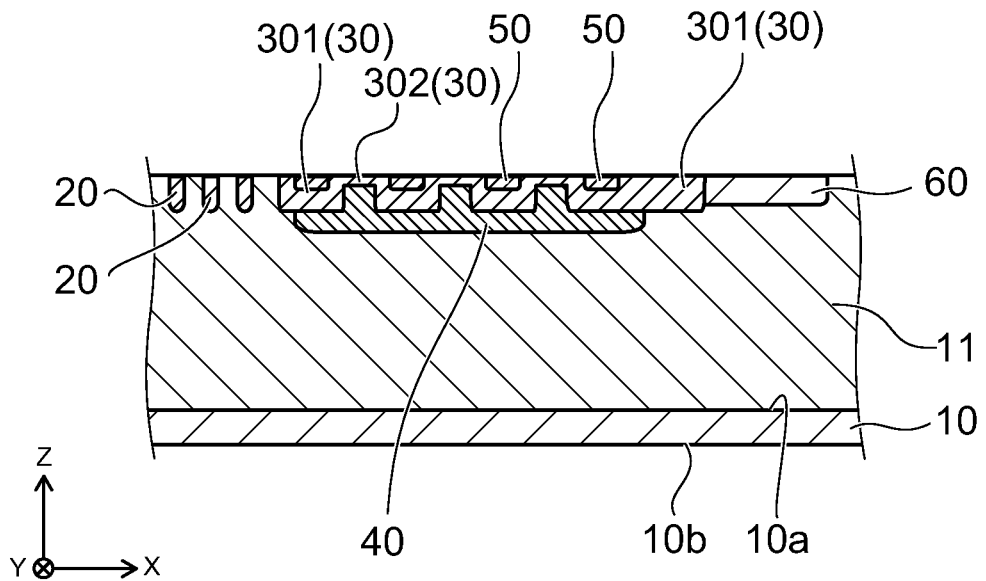
FIG. 6A and FIG. 6B are schematic cross-sectional views illustrating a method for manufacturing the semiconductor device.

Next, thermal diffusion is performed. Thereby, the ions of the ion implantation regions 20P, 301P, 302P, 40P, 50P, and 60P are activated to form the first p-type semiconductor region 20, the second p-type semiconductor region 30 (the first portion 301 and the second portion 302), the n$^{-}$-type semiconductor region 40, the p+-type semiconductor region 50, and the p−-type semiconductor region 60, as shown in FIG. 6A. On the n−−-type semiconductor region 11 side of the second p-type semiconductor region 30, the first portion 301 and the second portion 302 constitute a concave-convex form.

Figure 6B:
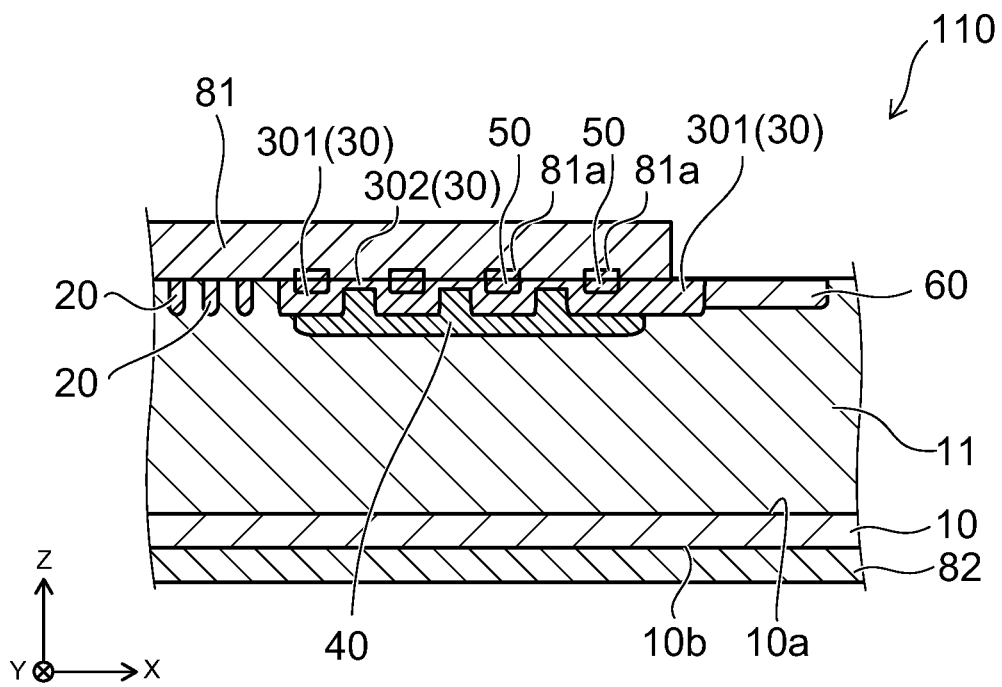

Next, as shown in FIG. 6B, the anode electrode 81 and the cathode electrode 82 are formed. The anode electrode 81 is formed on the n−−-type semiconductor region 11, the first p-type semiconductor region 20, the second p-type semiconductor region 30, and the p+-type semiconductor region 50. It is also possible to form the ohmic electrode 81a on the p+-type semiconductor region 50 and then form the anode electrode 81. Ni is used for the anode electrode 81, for example.

The cathode electrode 82 is formed in contact with the second surface 10b of the substrate 10. Ni is used for the cathode electrode 82, for example. Thereby, the semiconductor device 110 is completed.

In the method for manufacturing the semiconductor device 110 like this, the mask M2 shown in FIG. 4C is used to form the ion implantation region 20P of the first p-type semiconductor region 20 and the ion implantation region 301P of the first portion 301 of the second p-type semiconductor region 30. Furthermore, the mask M4 shown in FIG. 5B is used to form the ion implantation region 40P of the n−-type semiconductor region 40 and the ion implantation region 302P of the second portion 302 of the second p-type semiconductor region 30. That is, since a plurality of ion implantation regions are formed using one mask, the photolithography process for forming masks can be simplified.

Second Embodiment

Next, a second embodiment is described.

Figure 7:
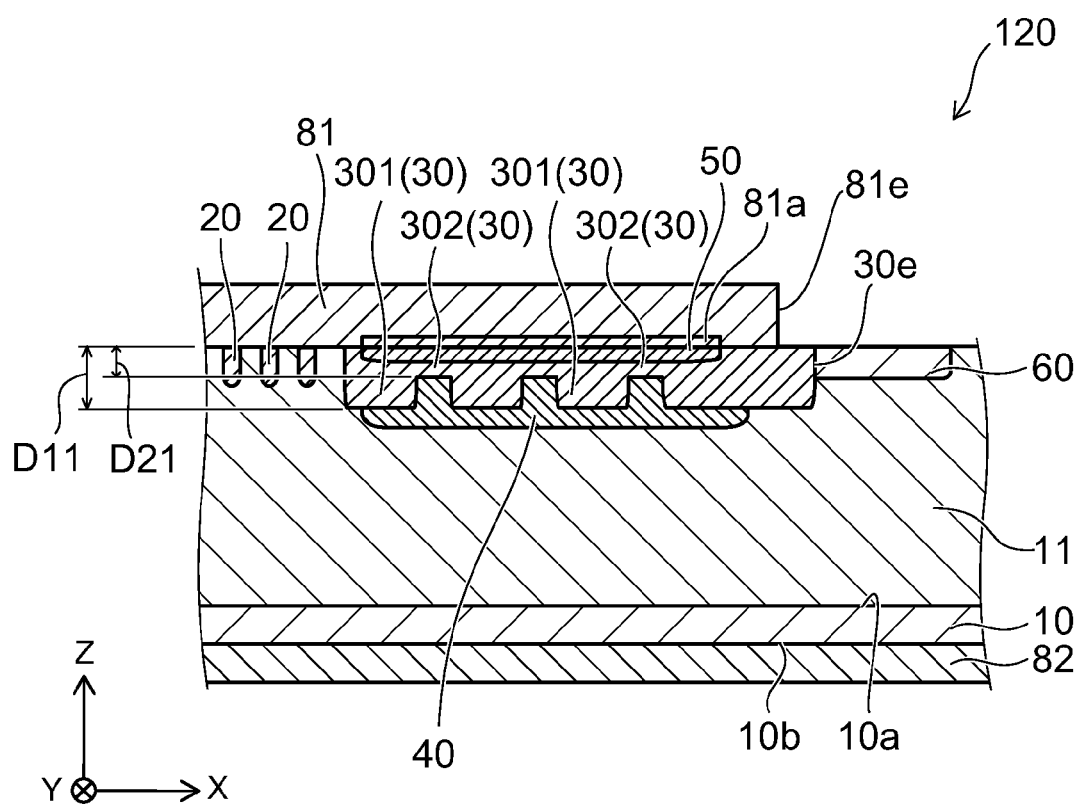
FIG. 7 is a schematic cross-sectional view illustrating the configuration of a semiconductor device according to a second embodiment.

FIG. 7 is a schematic cross-sectional view illustrating the configuration of a semiconductor device according to the second embodiment.

FIG. 7 shows a semiconductor device 120 according to the second embodiment.

In the semiconductor device 120 shown in FIG. 7, the size of the p+-type semiconductor region 50 is larger than the size of the p+-type semiconductor region 50 of the semiconductor device 110 according to the first embodiment. In the semiconductor device 120, the first portion 301 has a depth of D11, and the second portion 302 has a depth of D21. The depth D11 is deeper than the depth D1 of the first portion 301 of the semiconductor device 110, and the depth D21 is deeper than the depth D2 of the second portion 302 of the semiconductor device 110. Otherwise, the configuration is similar to the semiconductor device 110 according to the first embodiment.

The depth D21 is shallower than the depth D11. The p+-type semiconductor region 50 is provided between the first portion 301 and the second portion 302, and the anode electrode 81. The p+-type semiconductor region 50 is provided to extend over the first portion 301 and the second portion 302 on the inside of the second p-type semiconductor region 30. The depth of the p+-type semiconductor region 50 is shallower than the depth D21 of the second portion 302.

In the semiconductor device 120 like this, similarly to the semiconductor device 110, breakdown concentrated in the terminal region is suppressed by providing the second p-type semiconductor region 30 having the first portion 301 and the second portion 302. Furthermore, a good ohmic contact between the anode electrode 81 and the second p-type semiconductor region 30 is obtained by means of the p+-type semiconductor region 50 with a large area.

In the semiconductor device 120 according to the second embodiment, the withstand capability to surge voltage etc. is improved.

Next, layouts of the semiconductor devices 110 and 120 are described.

In the example shown in FIG. 2, the second p-type semiconductor region 30 is provided so as to surround the periphery of the plurality of first p-type semiconductor regions 20 as viewed in the Z-direction. That is, in the example shown in FIG. 2, the region of the avalanche diode is provided so as to surround the periphery of the JBS diode. The layout of the semiconductor device may be other than this.

Figure 8A:
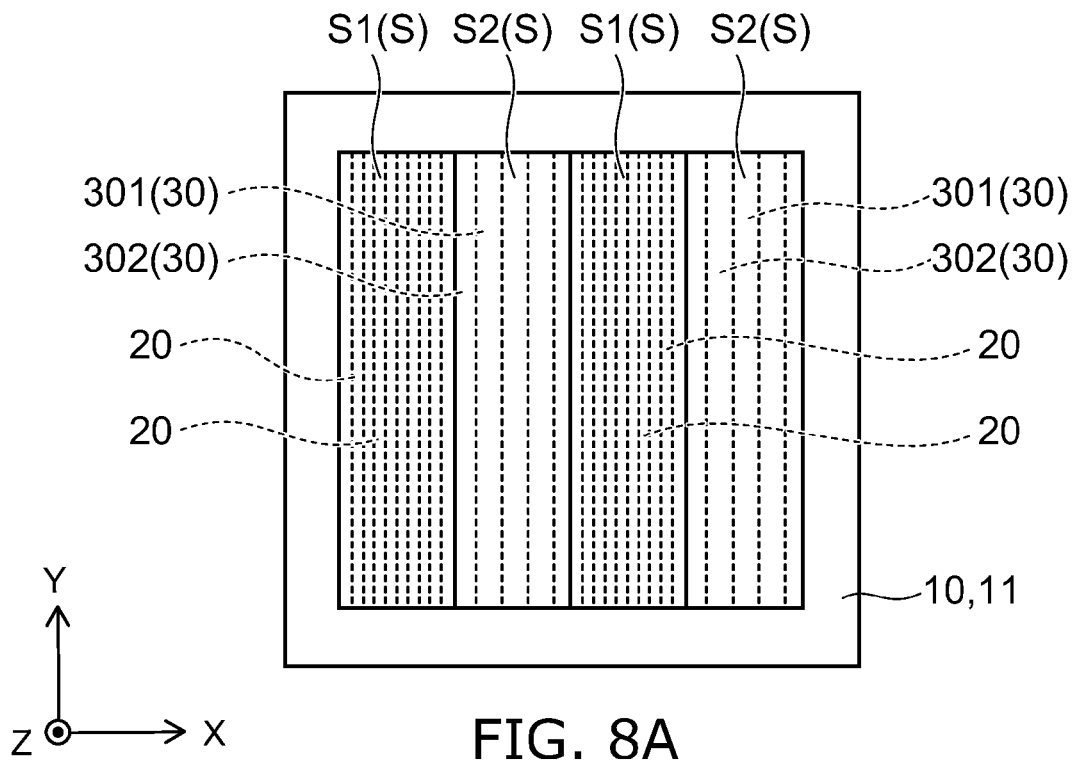
FIG. 8A and FIG. 8B are schematic plan views illustrating the configuration of a semiconductor device according to a third embodiment.
Figure 8B:
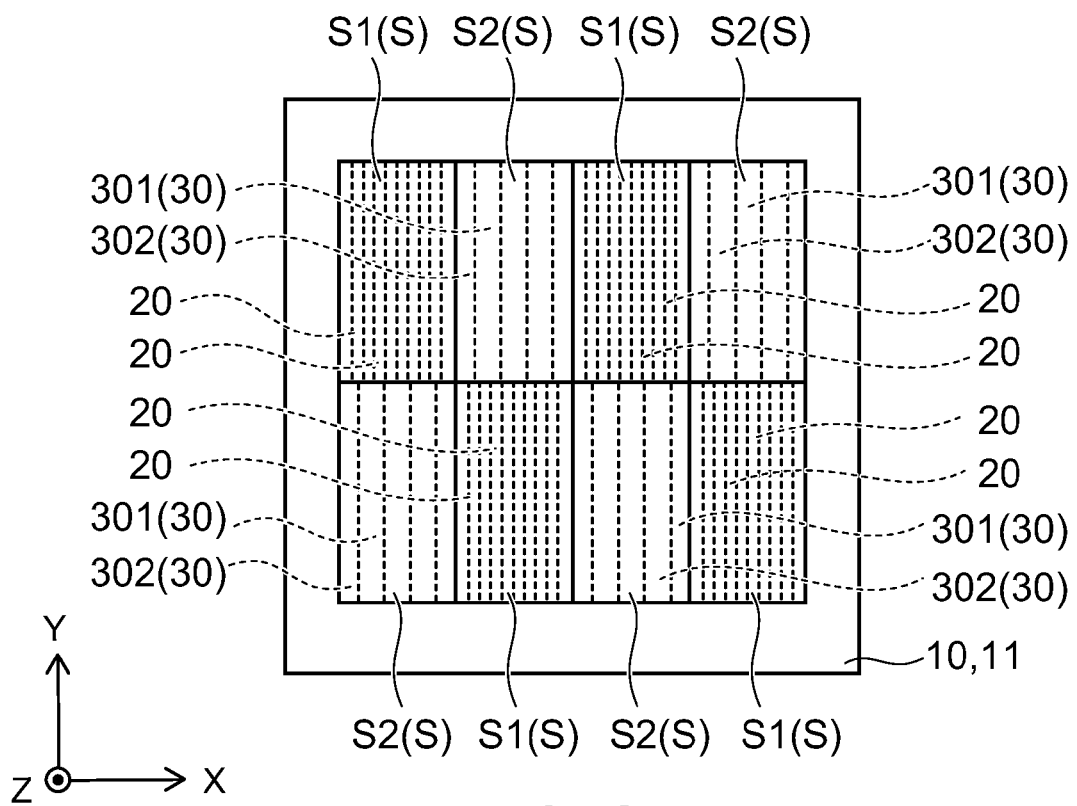

FIG. 8A and FIG. 8B are schematic plan views illustrating layouts of the semiconductor device.

FIG. 8A and FIG. 8B show examples of the layout as viewed in the Z-direction of the JBS diode and the avalanche diode. For convenience of description, in FIG. 8A and FIG. 8B, the region of the JBS diode in the rectangle substrate 10 is schematically shown as S1, and the region of the avalanche diode is schematically shown as S2. The regions S1 and S2 may be collectively referred to as a region S. The region S1 of the JBS diode includes the first p-type semiconductor region 20 expressed by the broken line in the drawings. The region S2 of the avalanche diode includes the first portion 301 and the second portion 302 of the second p-type semiconductor region 30 expressed by the broken line in the drawings.

In the example shown in FIG. 8A, a plurality of regions S are arranged in one direction. In the example shown in FIG. 8A, four regions S are aligned in the X-direction. The four regions S include two regions S1 of the JBS diode and two regions S2 of the avalanche diode. The two regions S1 of the JBS diode and the two regions S2 of the avalanche diode are alternately arranged in the X-direction. The number of regions S is not limited to four. Also the direction in which the regions are alternately arranged is not limited to the X-direction.

In the example shown in FIG. 8B, a plurality of regions S are arranged in each of the X-direction and the Y-direction. In the example shown in FIG. 8B, eight regions S are arranged. Of the eight regions S, four regions S are aligned in the X-direction, and two regions S are aligned in the Y-direction. The four regions S aligned in the X-direction include two regions S1 of the JBS diode and two regions S2 of the avalanche diode. The two regions S1 of the JBS diode and the two regions S2 of the avalanche diode are alternately arranged in the X-direction. The two regions S aligned in the Y-direction include one region S1 of the JBS diode and one region S2 of the avalanche diode.

The layouts of regions S shown in FIG. 8A and FIG. 8B are only examples, and layouts other than these are possible.

As described above, the semiconductor device according to the embodiment can improve the withstand capability to surge voltage etc.

Hereinabove, embodiments and variations thereof are described. However, the invention is not limited to these examples. For example, one skilled in the art may appropriately make additions, removals, and design modifications of components to the embodiments or the variations described above, and may appropriately combine features of the embodiments; such modifications also are included in the scope of the invention to the extent that the spirit of the invention is included.

For example, although the above embodiments and variations are described using the n-type as the first conductivity type and the p-type as the second conductivity type, the invention can be practiced also by using the p-type as the first conductivity type and the n-type as the second conductivity type. Furthermore, although the case where each semiconductor region includes SiC is used as an example, semiconductors other than SiC (for example, Si and GaN) may be used.

Furthermore, in the embodiments and the variations described above, various structures such as a RESURF structure, a guard ring structure, and a field plate structure may be used as the terminal structure, which is the p⁻-type semiconductor region 60.

Moreover, although examples in which the structure of the second p-type semiconductor region 30 is applied to a JBS diode are described in the above embodiments and variations, the invention is not limited thereto. The structure of the second p-type semiconductor region 30 may be applied to elements such as MOSFETs (metal oxide semiconductor field effect transistors) and IGBTs (insulated gate bipolar transistors).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a first semiconductor region of a first conductivity type;
a first electrode provided above the first semiconductor region;
a second semiconductor region of a second conductivity type provided between the first semiconductor region and the first electrode;
a third semiconductor region provided between the first semiconductor region and the first electrode, having an impurity concentration substantially equal to an impurity concentration of the second semiconductor region, and having a first portion and a second portion with a depth shallower than the first portion, the first portion and the second portion constituting a concave-convex form on a first semiconductor region side of the third semiconductor region; and
a second electrode provided above an opposite side of the first semiconductor region from the first electrode.

2. The device according to claim 1, wherein the first portion and the second portion are alternately arranged in a direction orthogonal to a direction from the first electrode toward the second electrode.

3. The device according to claim 1, further comprising a fourth semiconductor region of a first conductivity type provided between the first semiconductor region and the third semiconductor region and having an impurity concentration higher than an impurity concentration of the first semiconductor region.

4. The device according to claim 3, wherein the fourth semiconductor region includes SiC.

5. The device according to claim 1, further comprising a fifth semiconductor region of a second conductivity type provided between the third semiconductor region and the first electrode and having an impurity concentration higher than an impurity concentration of the third semiconductor region.

6. The device according to claim 5, wherein the fifth semiconductor region is provided between the second portion of the third semiconductor region and the first electrode.

7. The device according to claim 5, wherein the fifth semiconductor region is provided between the first portion of the third semiconductor region and the first electrode and between the second portion and the first electrode.

8. The device according to claim 7, wherein
the first portion and the second portion are alternately arranged in a direction orthogonal to a direction from the first electrode toward the second electrode and
the fifth semiconductor region is disposed continuously in the direction of being alternately arranged.

9. The device according to claim 5, further comprising a third electrode provided between the fifth semiconductor region and the first electrode and having a resistivity lower than a resistivity of the first electrode.

10. The device according to claim 9, wherein
the first electrode includes Ti and
the third electrode includes Ni.

11. The device according to claim 5, wherein the fifth semiconductor region includes SiC.

12. The device according to claim 5, wherein an outer periphery edge of the first electrode is provided between an end of the fifth semiconductor region and an end of the third semiconductor region as viewed in a direction connecting the first semiconductor region and the first electrode.

13. The device according to claim 1, further comprising a sixth semiconductor region of a second conductivity type provided adjacent to the third semiconductor region and having an impurity concentration lower than an impurity concentration of the third semiconductor region.

14. The device according to claim 13, wherein the sixth semiconductor region includes SiC.

15. The device according to claim 1, wherein the first semiconductor region, the second semiconductor region, and the third semiconductor region include SiC.

16. The device according to claim 1, wherein
an impurity concentration of the second semiconductor region is not less than $5 \times 10^{17}$ cm$^{-3}$ and not more than $1 \times 10^{19}$ cm$^{-3}$ and an impurity concentration of the third semiconductor region is not less than $5 \times 10^{17}$ cm$^{-3}$ and not more than $1 \times 10^{19}$ cm$^{-3}$.

17. The semiconductor device of claim 1, wherein the first portion and the second portion constituting the concave-convex form on the first semiconductor region side of the third semiconductor region is formed at the interface of the first semiconductor region and the third semiconductor region.

* * * * *